(12) United States Patent
Sugawara et al.

(10) Patent No.: US 6,310,527 B1
(45) Date of Patent: Oct. 30, 2001

(54) MULTI-LAYER CIRCUIT BOARD INCLUDING REACTANCE ELEMENT AND A METHOD OF TRIMMING A REACTANCE ELEMENT IN A CIRCUIT BOARD

(75) Inventors: Hiroshi Sugawara, Yokohama; Tamotsu Kaneko, Zama; Sadahiro Gomi; Masayuki Ito, both of Yokohama, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/218,023

(22) Filed: Dec. 22, 1998

(30) Foreign Application Priority Data

Dec. 26, 1997 (JP) .................................................. 9-360295

(51) Int. Cl.$^7$ ................................. H01P 7/06; H03J 3/20
(52) U.S. Cl. ............................................. 334/71; 333/236
(58) Field of Search .................................. 333/174, 185, 333/202, 205, 235, 236; 334/71

(56) References Cited

U.S. PATENT DOCUMENTS

| | | | |
|---|---|---|---|
| 4,470,096 | * 9/1984 | Guertin | 361/277 |
| 5,548,537 | 8/1996 | Taguchi | 364/571.02 |

FOREIGN PATENT DOCUMENTS

| | | |
|---|---|---|
| 0209816 | 1/1987 | (EP) . |
| 62-109418 | 5/1987 | (JP) . |
| 03 0883111 | 4/1991 | (JP) . |
| 7-297637 | 11/1995 | (JP) . |
| 102411990 | * 9/1998 | (JP) .................................. 361/303 |

* cited by examiner

Primary Examiner—Robert Pascal
Assistant Examiner—Kimberly E Glenn
(74) Attorney, Agent, or Firm—Connolly Bove Lodge & Hutz

(57) ABSTRACT

A reactance of a reactance element in a multi-layer circuit board apparatus is trimmed by cutting a portion of the circuit pattern of the reactance element with a laser beam. The reactance element is sandwiched between grounded layers. A coil circuit pattern having at least a hole therein may be provided as the reactance element. A side portion between the edge of the coil circuit pattern and the hole is cut with the laser beam to trim the inductive reactance. Cutting is effected while the circuit is operated and the operating condition such as an oscillation frequency is observed. A plurality of holes may be provided in the coil circuit pattern. The trimming amount of the inductive reactance is determined by the number of the hole subjected to cutting. The holes may have different sizes. The trimming amount is obtained by which one of the hole is subjected to cutting. The distance between the cut circuit pattern is equal to or larger than the thickness of the circuit pattern. A capacitive element may be provided as the reactance element which includes first and second comb circuit patterns of which teeth are interlace with each other. A portion of a tooth is cut to trim the capacitive reactance. Another capacitive reactance element including two conductor insulated with a dielectric substrate can be also trimmed similarly.

22 Claims, 5 Drawing Sheets

MULTI-LAYER CIRCUIT BOARD INCLUDING REACTANCE ELEMENT AND A METHOD OF TRIMMING A REACTANCE ELEMENT IN A CIRCUIT BOARD

BACKGROUND OF THE INVENTION

1. Field of the Invention

This invention relates to a multi-layer circuit board including a reactance element and a method of trimming a reactance element in a circuit board.

2. Description of the Prior Art

A multi-layer printed circuit board including inductance trimming patterns is known. Japanese patent application provisional publication No. 62-109418 discloses a chip type delay element including an inductance pattern formed on a surface of a dielectric substrate and comb electrodes, wherein the comb electrodes are subjected to a laser cut process to provide a desired delay time.

Japanese patent application provisional publication No. 7-297637 discloses a resonating circuit board including a microstrip conductor as inductance element and a plurality of stab conductors for controlling the line length of the microstrip conductor, a capacitive electrode patterns, and timing conductors for trimming the capacitance of the capacitive electrode patters.

SUMMARY OF THE INVENTION

The aim of the present invention is to provide a superior multi-layer circuit board including a reactance element and a superior method of trimming a reactance element in a circuit board.

According to the present invention there is provided a multi-layer circuit board including: first to third conductive layers, the first and third conductive layers being grounded; a first dielectric substrate sandwiched between the first and second conductive layers; a second dielectric layer sandwiched between the second and third conductive layers; and a trimming reactance circuit including first and second circuit patterns at the second conductive layer cooperatively providing either of a first reactance or a second reactance, the second circuit pattern being to be cut as required, the first reactance being provided when the second circuit pattern is not cut and the second reactance being provided when the second circuit pattern is cut.

In the multi-layer circuit board, the first to third conductive layers and the first and second dielectric layers are successively arranged.

The multi-layer circuit board may further include a third dielectric layer and a fourth conductive layer on the third dielectric layer and the third dielectric layer and the fourth dielectric layer are sandwiched between the first dielectric substrate and the second conductive layer, wherein the trimming reactance circuit includes a capacitive element which is provided at the second and fourth conductive layers.

In the multi-layer circuit board, the trimming reactance circuit may include a coil circuit pattern having a hole therein and a side portion between the hole and an adjacent side edge of the coil circuit pattern corresponding to the second circuit pattern. In this case, the coil circuit pattern may have a plurality of holes. Moreover, in this case, a plurality of the holes may have different sizes.

According to the present invention there is further provided a first method of trimming a reactance element including the steps of: providing a multi-layer circuit board including first to third conductive layers, the first and third conductive layers being to be grounded; a first dielectric substrate sandwiched between the first and second conductive layers; a second dielectric layer sandwiched between the second and third conductive layers; and the reactance element at the second conductive layer; and selectively cutting a portion of the reactance element with an energy beam to trim a reactance of the reactance element. In this case, the portion may be cut by making a hole with the energy beam from the side of the first conductive layer, such that a depth of the hole reaches to the reactance element but does not reach to the third conductive layer. Moreover, the portion may be cut at a plurality points at the portion. Moreover, the reactance element includes a circuit pattern having a thickness and is cut to provide an interval equal to or larger than the thickness.

According to the present invention there is further provided a second method of trimming a reactance element including a circuit pattern at one of conductive layers of a multi-layer circuit board, comprising the steps of; operating the circuit board apparatus; observing an operating condition of the circuit board apparatus; and selectively cutting a portion the circuit with an energy beam in accordance with the operating condition.

In this case, the step of cutting the second circuit pattern may be effected while the circuit board apparatus is being operated. Moreover, the circuit pattern has a thickness and is cut to provide an interval larger than the thickness.

According to the present invention there is further provided a third method of trimming a coil circuit provided at one of conductive layers of a multi-layer circuit board apparatus, the coil circuit including a circuit pattern having a plurality of holes therein along the circuit pattern, for providing an initial inductance, each of holes being arranged between first and second side portions provided between side edges of the circuit pattern, including the steps of: operating the multi-layer circuit board apparatus; observing an operation condition of the multi-layer circuit board apparatus; determining a trimming inductance in accordance with the operation condition; and selectively cutting the first side portion of at least one of a plurality of the holes in accordance with the trimming inductance.

In the third method, the step of cutting is performed with an energy beam applied to the first side portion of at least one of the plurality of the hole.

In the third method, the plurality of holes have the same size and the method further comprising the step of determining the number of the holes of which one of the first side portion is cut in accordance with the trimming inductance.

In the third method, the plurality of holes have different sizes and the method further includes the step of determining which one of the holes of which the first side portion is cut in accordance with the trimming inductance.

The third method may further include the step of providing ground layers sandwiching the circuit pattern with isolation.

According to the present invention there is further provided a fourth method of trimming a capacitive circuit provided at one of conductive layers of a multi-layer circuit board apparatus, the capacitive circuit including first and second comb circuit patterns of which teeth of the first and second comb circuit patterns are interlaced with each other with isolation for providing a capacitance, including the steps of: operating the circuit board apparatus; observing an operation condition of the multi-layer circuit circuit board apparatus; determining a trimming capacitance in accordance with the operation condition; and selectively cutting a portion of the teeth of the first comb circuit patterns in accordance with the trimming capacitance.

In the fourth method, the step of selectively cutting a portion of the teeth of the first comb circuit patterns is performed with an energy beam applied to the portion.

The fourth method may further include the step of providing ground layers sandwiching the circuit pattern with isolation.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

<First Embodiment>

Figure 1:
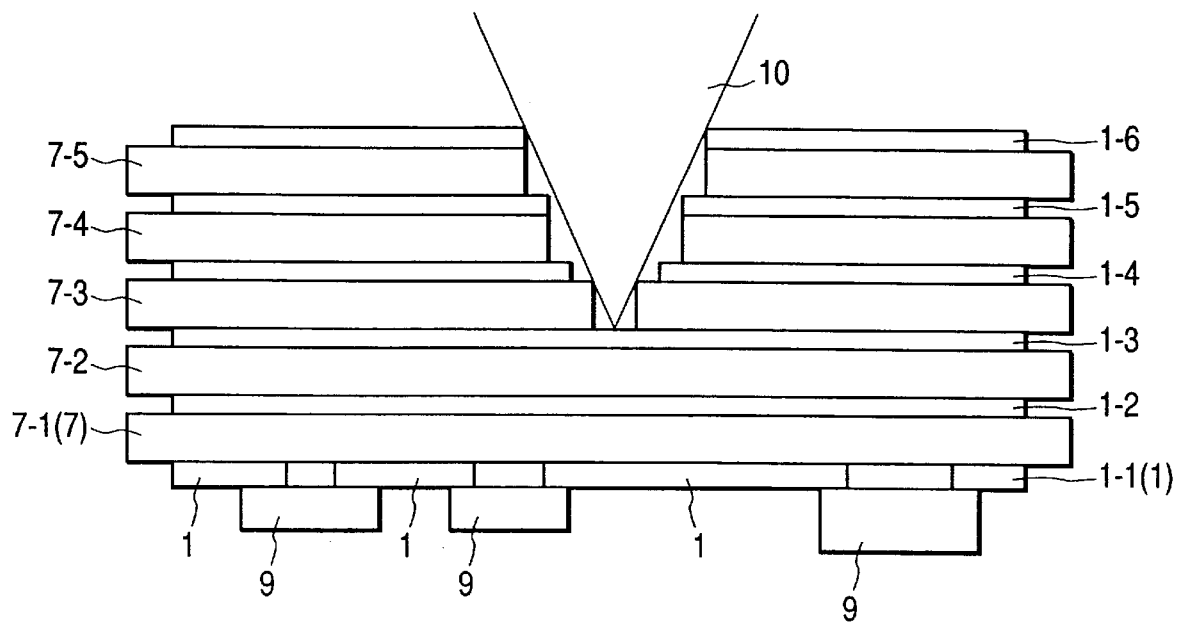
FIG. 1 is a side cross-sectional view of a multi-layer circuit board apparatus of a first embodiment.
Figure 2:
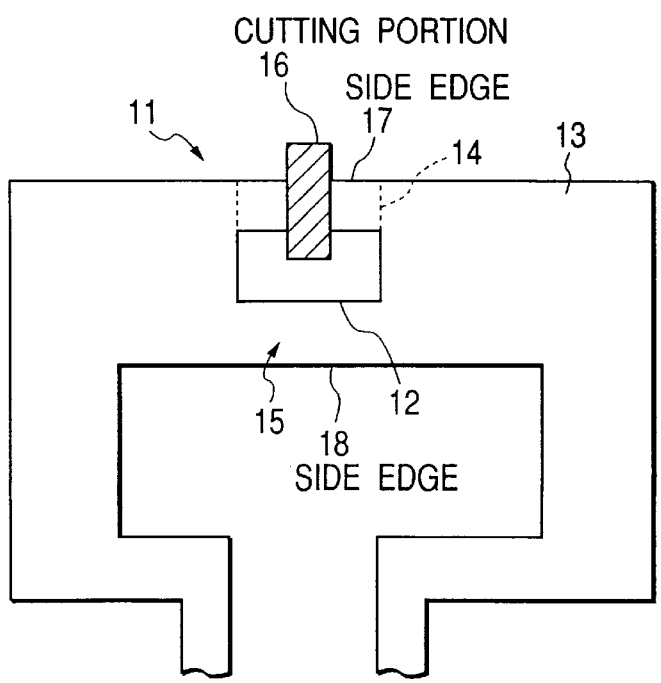
FIG. 2 is a partial plan view of a reactance element in the multi-layer circuit board apparatus shown in FIG. 1.

FIG. 1 is a side cross-sectional view of a multi-layer circuit board apparatus of a first embodiment. FIG. 2 is a partial plan view of a reactance element in the multi-layer circuit board apparatus shown in FIG. 1.

The multi-layer circuit board apparatus includes a multi-layer circuit board and electronic parts 9 on the multi-layer circuit board. The multi-layer circuit board includes first to sixth conductive layers 1-1 to 1-6 (1) and first to fifth dielectric substrate 7-1 to 7-5 (7). Each of the dielectric substrate 7 is sandwiched two conductive layers 1. A coil circuit pattern 11 as a reactance element is provided at the fourth conductive layer 1-4 and portions of the third and fifth conductive layer which is under and above the coil circuit pattern 11 are grounded at least.

As shown in FIG. 2, the coil circuit pattern 11 has a hole 12 to be cut when trimming is necessary. That is the coil circuit pattern 11 includes a first circuit pattern 13 having a C shape and a second circuit pattern (side portion) 14 for providing a first inductive reactance and when the second circuit pattern (side portion) 14 is cut by applying a laser beam 10 as an energy beam as shown in FIG. 1, the coil circuit pattern 11 provides a second inductive reactance (trimmed inductive reactance). The hole 12 is arranged between the side portions 14 and 15 provided between side edges 17 and 18.

Figure 3:
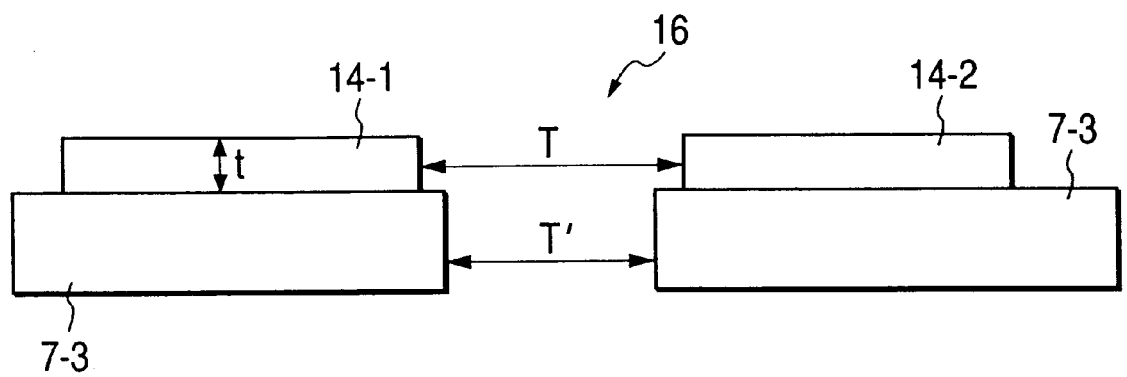
FIG. 3 is a partial side cross-sectional view of the reactance element in the multi-layer circuit board apparatus of the first embodiment.

FIG. 3 is a partial side cross-sectional view of the reactance element in the multi-layer circuit board apparatus of the first embodiment.

The second circuit pattern 14 having a thickness t is cut by applying the laser beam 10 as the second circuit patterns 14-1 and 14-2. The distance (interval) T between the second circuit pattern 14-1 and 14-2 is equal to or larger than the thickness t to provide a stable operating condition.

Figure 4:
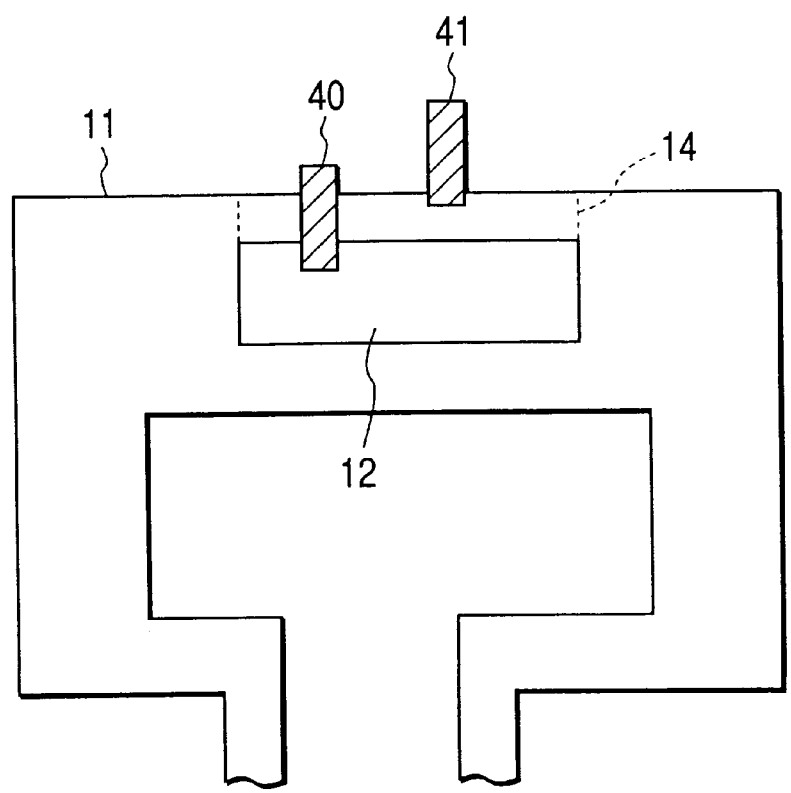
FIG. 4 is a partial plan view of the reactance element in the multi-layer circuit board apparatus of the first embodiment.

FIG. 4 is a partial plan view of the reactance element in the multi-layer circuit board apparatus of the first embodiment.

The second circuit pattern 14 is cut by the laser beam a plurality of times. That is, the second circuit pattern 14 is cut at the cutting portions 40 and 41 to provide a surer insulation in consideration of the accuracy of the position of the circuit patterns.

Figure 5:
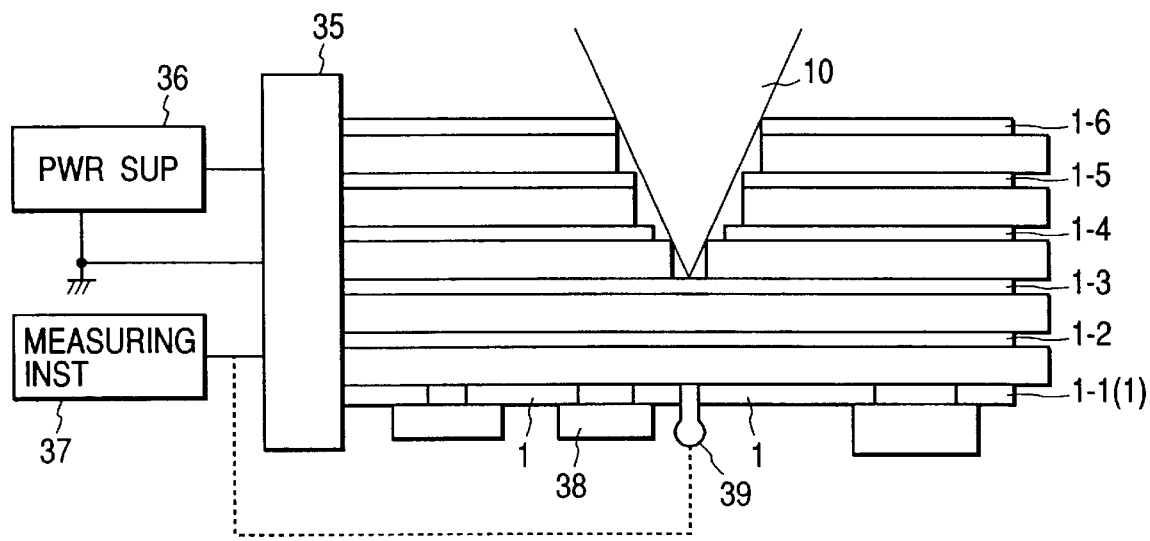
FIG. 5 is a side cross-sectional view of the multi-layer circuit board apparatus of the first embodiment.

FIG. 5 is a side cross-sectional view of the multi-layer circuit board apparatus of the first embodiment. The multi-layer circuit board apparatus is operated by connecting a connector 35 which is connected to the ground and a power supply 36 and to a measuring instrument 37. The measuring instrument 37 is connected to an output of a high frequency circuit 38 including the coil circuit pattern 11, such as an oscillation circuit and a filter circuit. The measuring instrument 37 may be connected to a test point 39 connected to the output of the high frequency circuit 38.

In the case of the oscillation circuit, the oscillation frequency is observed by the measuring instrument 37 and a trimming amount is determined in accordance with the observed oscillation frequency, that is, a deviation from the target oscillation frequency. If trimming the inductive reactance is necessary, the second circuit pattern 14 is cut by the laser beam 10 during operation of the multi-layer circuit board apparatus. After cutting the second circuit pattern 14, the oscillation frequency is observed again to check the oscillation frequency. In this case, it is possible to confirm the trimmed oscillation frequency successively because the multi-layer circuit board apparatus is operated during cutting. Therefore, the processing is efficient, that is, processing is completed within a short interval. Then, the individual of products of the multi-layer circuit board apparatus is successively trimmed. However, it is also possible to cut the second circuit pattern 14 after the connector is disconnected (after observing). Moreover, once it is determined that the timing is necessary for all products of the multi-layer circuit boards, the second circuit patterns are cut without observing. In this embodiment, the observation is made in the built-in condition of the multi-layer circuit board apparatus, so that the actual operating condition is stably provided.

<Second Embodiment>

Figure 6:
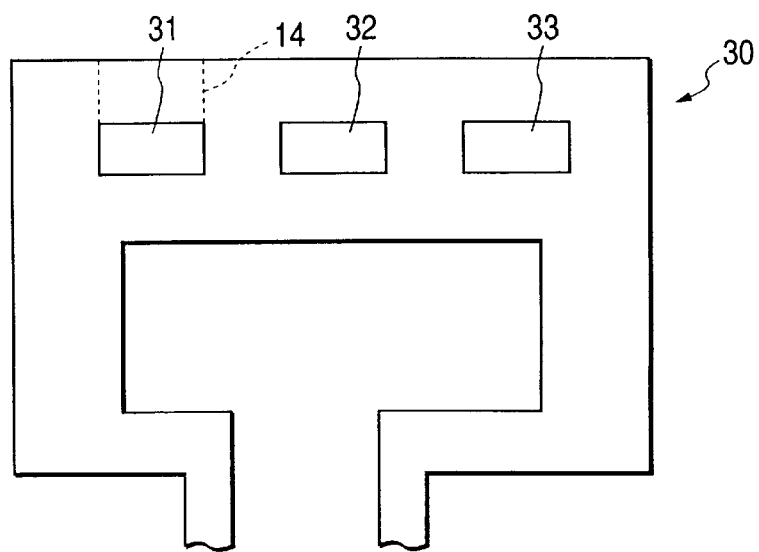
FIG. 6 is a partial plan view of a reactance element in the multi-layer circuit board apparatus of a second embodiment.

FIG. 6 is a partial plan view of a reactance element in the multi-layer circuit board apparatus of a second embodiment. The multi-layer circuit board of the second embodiment is substantially the same as that of the first embodiment. The difference is that a plurality of holes 31 to 33 are provided in the coil circuit pattern 30. The sizes of the holes 31 to 33 are the same, that is, the trimming amount of respective holes 31 to 33 are substantially the same. Then, the trimming amount is determined by the number of holes of which the second patterns 14 are cut.

<Third Embodiment>

Figure 7A:
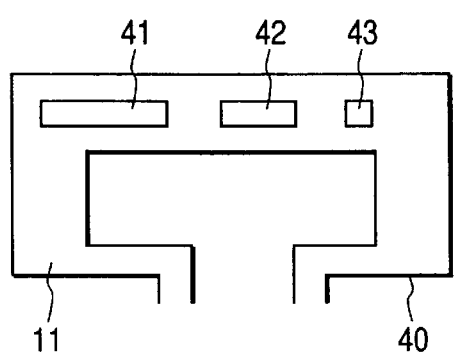
FIGS. 7A and 7B are partial plan views of a reactance element in the multi-layer circuit board apparatus of a third embodiment.
Figure 7B:
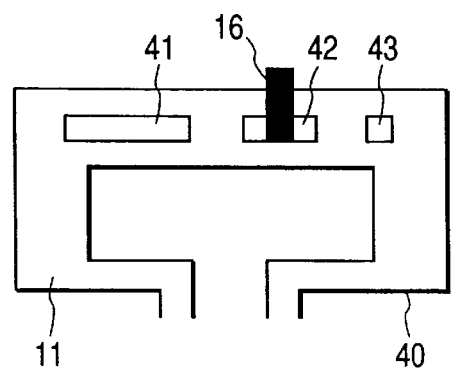

FIGS. 7A and 7B are partial plan views of a reactance element in the multi-layer circuit board apparatus of a third embodiment. The multi-layer circuit board apparatus of the third embodiment is substantially the same as that of the first embodiment. The difference is that a plurality of holes 41 to 43 are provided in the coil circuit pattern 40. The sizes of the holes 41 to 43 are different. That is, the trimming amounts of respective holes 41 to 43 are different. Then, the trimming amount is determined by which one of holes of which the second pattern 16 is cut. In this case, it is also possible to cut the second circuit patterns 16 of more than one of holes 41 to 43.

<Fourth Embodiment>

Figure 8:
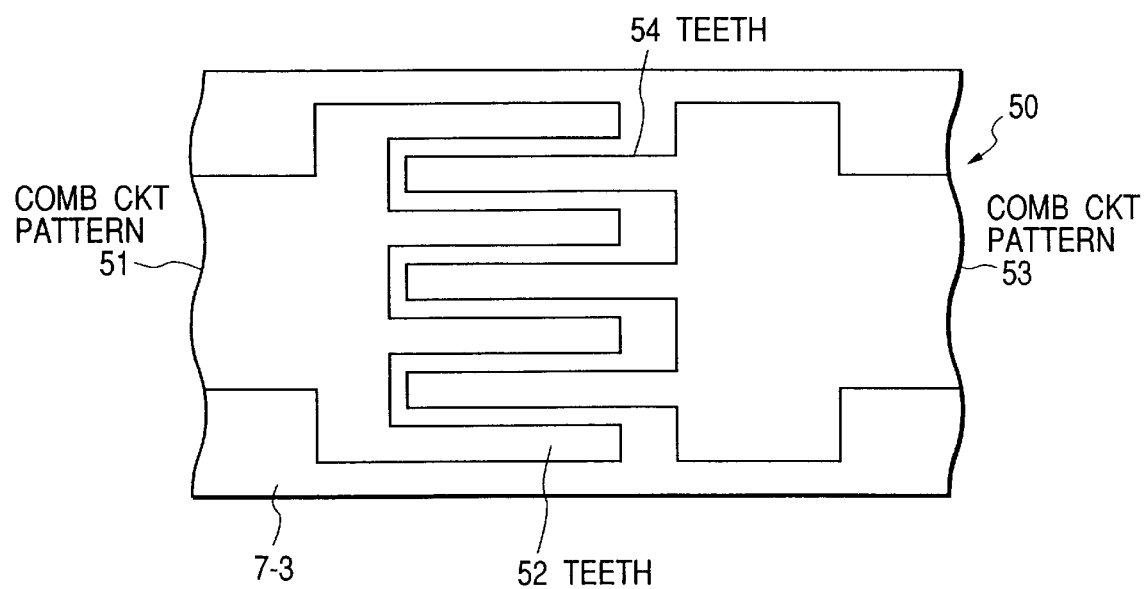
FIG. 8 is a partial plan view of a reactance element in the multi-layer circuit board apparatus of a fourth embodiment.

FIG. 8 is a partial plan view of a reactance element in the multi-layer circuit board apparatus of a fourth embodiment. The multi-layer circuit board apparatus of the fourth embodiment is substantially the same as that of the first embodiment. The difference is that a capacitive reactance element 50 is provided as the reactance element instead the inductive reactance element.

The capacitive reactance element 50 is formed on the dielectric substrate including a first comb circuit pattern 51 having teeth 52 and a second comb circuit pattern 53 having teeth 54 which are interlaced with the teeth 52.

Figure 9:
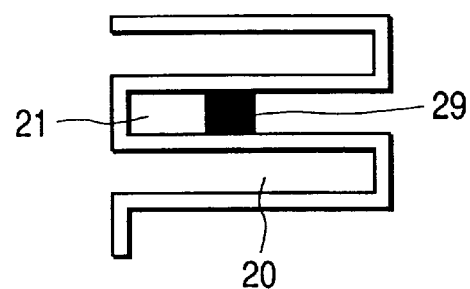
FIG. 9 is a partial view of teeth in the multi-layer circuit board apparatus of the fourth embodiment.

FIG. 9 is a partial view of teeth in the multi-layer circuit board apparatus of the fourth embodiment. The tooth of second comb circuit pattern 53 is cut by the laser beam 10 to trim the capacitance of the capacitive reactance element 50.

<Fifth Embodiment>

Figure 10:
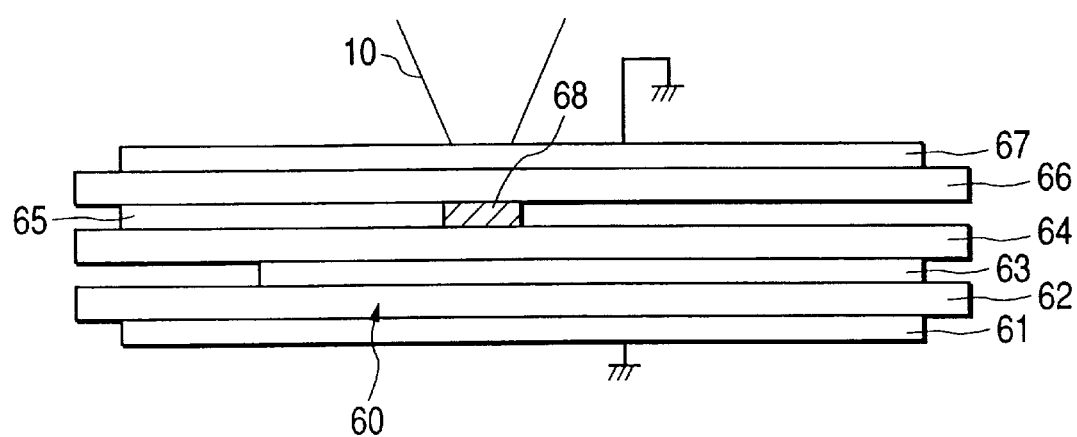
FIG. 10 is a side cross-sectional view of a reactance element in the multi-layer circuit board apparatus of a fifth embodiment.

FIG. 10 is a side cross-sectional view of a reactance element in the multi-layer circuit board apparatus of a fifth embodiment. The multi-layer circuit board apparatus of the fifth embodiment is substantially the same as that of the fourth embodiment. The difference is that a capacitive reactance element 60 including two conductive layers 63 and 65 insulated with a dielectric substrate 64. The capacitive reactance element 60 is sandwiched between the grounded conductive layer 61 and 67. Portions of the conductive layers 63 and 65 overlapping with each other provides a capacitive reactance. The laser beam 10 cuts a tip 68 of the conductive layer 65 to trim the capacitive reactance.

What is claimed is:

1. A multi-layer circuit board comprising:
   first, to third conductive layers, said first and third conductive layers being grounded;
   a first dielectric substrate sandwiched between said first and second conductive layers;
   a second dielectric layer sandwiched between said second and third conductive layers; and
   trimming reactance means including first and second circuit patterns at said second conductive layer cooperatively providing either of a first reactance or a second reactance, said second circuit pattern being cut as required, said first reactance being provided when said second circuit pattern is not cut and said second reactance being provided when said second circuit pattern is cut.

2. The multi-layer circuit board as claimed in claim 1, wherein said first, second and third conductive layers and said first and second dielectric layers are successively arranged.

3. The multi-layer circuit board as claimed in claim 1, further comprising a third dielectric layer and a fourth conductive layer on said third dielectric layer, said third dielectric layer and said fourth dielectric layer are sandwiched between said first dielectric substrate and said second conductive layer, said fourth conductive layer being on said first dielectric layer, wherein said trimming reactance means comprises a capacitive element which is provided at said second and fourth conductive layers.

4. The multi-layer circuit board as claimed in claim 1, wherein said trimming reactance means comprises a coil circuit pattern having a hole therein and a side portion between said hole and an adjacent side edge of said coil circuit pattern corresponding to said second circuit pattern.

5. The multi-layer circuit board as claimed in claim 4, wherein said coil circuit pattern has a plurality of holes.

6. The multi-layer circuit board as claimed in claim 5, wherein a plurality of said holes have different sizes.

7. A method of trimming a reactance element comprising the steps of:
   providing a multi-layer circuit board including first to third conductive layers, said first and third conductive layers being grounded; a first dielectric substrate sandwiched between said first and second conductive layers; a second dielectric layer sandwiched between said second and third conductive layers; and said reactance element including first and second circuit patterns at said second conductive layer; and
   selectively cutting said second circuit pattern of said reactance element with an energy beam to trim a reactance of said reactance element.

8. The method as claimed in claim 7, wherein said portion is cut by making a hole with said energy beam from the side of said first conductive layer, such that a depth of said hole reaches to said reactance element but does not reach to said third conductive layer.

9. The method as claimed in claim 7, wherein said portion is cut at a plurality points at said portion.

10. The method as claimed in claim 7, wherein said reactance element includes a circuit pattern having a thickness and is cut to provide an interval equal to or larger than said thickness.

11. A method of trimming a reactance element including a circuit pattern at one of conductive layers of a multi-layer circuit board, said reactance element being operated by a high frequency circuit on said multi-layer circuit board, comprising the steps of:
   operating said circuit board apparatus;
   observing an operating condition of said circuit board apparatus; and
   selectively cutting a portion said circuit pattern with an energy beam in accordance with said operating condition.

12. The method as claimed in claim 11, wherein the step of cutting said second circuit pattern is effected while said circuit board apparatus is being operated.

13. The method as claimed in claim 11, wherein said circuit pattern has a thickness and is cut to provide an interval larger than said thickness.

14. The method as claimed in claim 11, further comprising the step of providing ground layers sandwiching said circuit pattern with isolation.

15. A method of trimming a coil circuit provided at one of conductive layers of a multi-layer circuit board apparatus, said coil circuit including a circuit pattern having a plurality of holes therein along said circuit pattern, for providing an initial inductance, each of holes being arranged between first and second side portions provided between side edges of said circuit patterns, said coil circuit being operated by a high frequency circuit on said multi-layer circuit board, comprising the steps of:

operating said multi-layer circuit board apparatus;

observing an operation condition of said multi-layer circuit board apparatus;

determining a trimming inductance in accordance with said operation condition; and selectively cutting said first side portion of at least one of said plurality of said holes in accordance with said trimming inductance.

16. The method as claimed in claim 15, wherein the step of cutting is performed with an energy beam applied to said said first side portion of said at least one of said plurality of said hole.

17. The method as claimed in claim 15, wherein said plurality of holes having the same size and the method further comprising the step of determining the number of said holes of which said first side portion is cut in accordance with said trimming inductance.

18. The method as claimed in claim 15, wherein said plurality of holes having different sizes and the method further comprising the step of determining which one of said holes of said first side portion is cut in accordance with said trimming inductance.

19. The method as claimed in claim 15, further comprising the step of providing ground layers sandwiching said circuit pattern with isolation.

20. A method of trimming a capacitive circuit provided at one of conductive layers of a multi-layer circuit board apparatus, said capacitive circuit including first and second comb circuit patterns, on said one of said conductive layer, of which teeth of said first and second comb circuit patterns are interlaced with each other with isolation for providing a capacitance, said capacitive circuit being operated by a high frequency circuit on said multi-layer circuit board, comprising the steps of:

operating said circuit board apparatus;

observing an operation condition of said multi-layer circuit board apparatus;

determining a trimming capacitance in accordance with said operation condition; and selectively cutting a portion of said teeth of said first comb circuit patterns in accordance with said trimming capacitance.

21. The method as claimed in claim 20, wherein the step of selectively cutting a portion of said teeth of said first comb circuit patterns is performed with an energy beam applied to said portion.

22. The method as claimed in claim 20, further comprising the step of providing ground layers sandwiching said capacitive circuit pattern with isolation.

* * * * *